United States Patent [19]

Morris et al.

[11] Patent Number: 4,916,673
[45] Date of Patent: Apr. 10, 1990

[54] METHOD AND APPARATUS FOR DETECTING THE PEAK OF AN ANALOG SIGNAL

[75] Inventors: Steven A. Morris, Sand Springs; Houston B. Mount, Tulsa, both of Okla.

[73] Assignee: Amoco Corporation, Chicago, Ill.

[21] Appl. No.: 212,555

[22] Filed: Jun. 28, 1988

Related U.S. Application Data

[62] Division of Ser. No. 37,305, Apr. 10, 1987, Pat. No. 4,777,629.

[51] Int. Cl.⁴ .................. G01V 1/40; H03K 5/153; H03K 17/00
[52] U.S. Cl. .................. 367/69; 328/151; 307/351
[58] Field of Search ................ 367/69, 28-34; 328/151; 307/351

[56] References Cited

U.S. PATENT DOCUMENTS

| | | | |
|---|---|---|---|
| 3,668,619 | 6/1972 | Dennis | 367/69 |
| 4,463,378 | 7/1984 | Rambow | 367/69 |
| 4,740,930 | 4/1988 | Broding | 367/69 |
| 4,777,629 | 10/1988 | Morris et al. | 367/69 |

Primary Examiner—Thomas H. Tarcza
Assistant Examiner—Ian J. Lobo

[57] ABSTRACT

A method and apparatus for processing a signal generated by a borehole scanning system of the type in which periodic electrical firing pulses initiate a plurality of corresponding acoustic energy pulses which are transmitted from the central portion of the borehole toward the borehole wall in a plurality of radial directions and at a plurality of different depths, thereby generating reflected acoustic pulses which are detected and converted to electrical pulses. The electrical pulse is periodically sampled with each sample level being converted to a digital number. A counter initiates counting in response to the firing pulse preceding the sample electrical pulse. Upon detection of the peak of the electrical pulse, the counter count is stored. Upon detection of the electrical pulse again falling below a preselected level, the count is again stored. Then the time midway between the two stored counts is determined.

8 Claims, 6 Drawing Sheets

METHOD AND APPARATUS FOR DETECTING THE PEAK OF AN ANALOG SIGNAL

This is a divisional of copending application Ser. No. 037,305 filed Apr. 10, 1987, now U.S. Pat. No. 4,777,629.

BACKGROUND OF THE INVENTION

1. Field of the Invention

The present invention pertains to methods and apparatus for detecting the peak of an electrical pulse and more specifically to such methods and apparatus which associate the peak value of the pulse with a value related to the time at which the peak occurs.

2. Setting of the Invention

There are a number of different circumstances in which it is desirable to determine the peak value of an electrical pulse. One technique for determining the peak value is to apply the signal to a peak and hold circuit. In the most simple form, a peak and hold circuit comprises a capacitor having one end grounded with the cathode of a diode connected to the other end. After the pulse is applied to the diode anode, the charge on the capacitor, which is substantially equal to the peak value of the pulse, can be measured. Sometimes it is desirable to associate the peak value of a pulse with a number indicative of the elapsed time between a preceding event and the occurrence of the peak. Such association is desirable when processing electrical pulses generated by a wellbore scanning device sometimes known as a borehole televiewer.

Generally speaking, a borehole televiewer is a downhole tool which includes a transducer mounted on a rotating shaft which generates acoustic pulses responsive to electrical firing pulses applied to the transducer. As the tool is moved axially along the wellbore, downhole circuitry generates periodic firing pulses, thus causing the tool to radially transmit acoustic pulses which helically can the borehole wall. Usually, the acoustic pulse emitted from the transducer strikes the borehole wall and reflects back to the transducer, thus generating a reflected pulse which is detected by the transducer and converted into an electrical pulse. Information regarding the relative times at which the firing pulses and the electrical pulses occur and the magnitude of the electrical pulses is transmitted to the surface on a cable. This information can be used to generate a video display of the borehole wall which the tool has scanned. In one such video display, the time between each firing pulse, which initiates the acoustic pulse, and the detection of the peak of the following electrical pulse is calculated. Each time is assigned a different digital number with the numbers being used to modulate the brightness or z-axis of a video monitor while a horizontal or x-axis sweep is initiated for each full revolution of the transducer. Thus, a new sweep of the video monitor is initiated for each 360° scan of the borehole wall. U.S. Pat. No. 4,463,378 to Rambow and U.S. Pat. No. 3,668,619 to Dennis each disclose borehole televiewer systems which generate signals as described above.

In order to generate such a video display, it is necessary to calculate the time between each firing pulse and the occurrence of the peak of the electrical pulse generated by the reflection of the acoustic pulse.

In Rambow, a scheme for detecting the peak of each electrical pule and calculating the elapsed time between the peak and the preceding firing pulse is disclosed. The Rambow scheme uses a peak and hold circuit for detecting the peak of each electrical pulse. In order to prevent the detection of noise or of a boot signal, which is caused when the electrical pulse amplifier is turned on, an arbitrary threshold level is set below which no peak detection occurs. The occurrence of each firing pulse starts a counter which counts upwardly until the electrical pulse rises above the threshold level at which point the counter is stopped. It should be noted that in the Rambow scheme, the time value associated with the peak value does not occur at the peak, but rather occurs when the signal rises above the threshold. It can thus be seen that when the amplitude of the detected pulses varies, the time value associated with each pulse will also vary, even though there may be the same elapsed time between each pulse peak and the preceding firing pulse. This effect becomes worse as the rise time of the pulse leading edge increases.

Another disadvantage with the Rambow scheme is that low amplitude electrical pulses are sometimes missed because the threshold must be greater than the amplitude of the boot signal generated when the amplifier is turned on. Although higher than the amplitude of the boot signal, the threshold may not be high enough to avoid noise-generated signals and thus the counter may be stopped prematurely as a result of noise having an amplitude greater than the threshold level. This is especially true for noise generated while the signal is falling from the boot signal or firing pulse. Still another disadvantage in Rambow occurs when the electrical pulse has a substantially flat top. In such a case it would be desirable to measure elapsed time to approximately half way between the beginning and end of the top rather than only to the beginning of the pulse top.

Another prior art circuit for detecting the peak of an electrical pulse and associating the detected value with an elapsed time between a prior event and the electrical pulse peak includes a pair of counters. The output of the first counter is provided to a digital-to-analog converter, the output of which is applied to one input of a comparator. The electrical pulse is applied to the other comparator input with the comparator output being fed back to the input of the first counter. The second counter initiates timing at the clock rate upo the occurrence of an initiating pulse. The first counter counts only when the electrical pulse exceeds the output of the digital-to-analog converter, thus generating a count on the output of the first counter proportional to the level of the electrical pulse. Each count of the first counter causes the elapsed time in the second counter to be stored and thus, upon the occurrence of the peak of the electrical pulse, the first counter output is a digital number related to the peak magnitude of the electrical pulse and the second counter output is a digital number related to the elapsed time between the occurrence of the initiating pulse and the occurrence of the peak of the electrical pulse.

The two-counter circuit suffers from a drawback in that for fast raising signals, in the order of 10 microseconds, the first counter must be able to count to approximately its maximum level within the rise time of the signal. If 8-bit resolution is desired, 256 counts must be made within 10 microseconds which, although possible, requires sophisticated (and expensive) state-of-the-art counters. For signals with rise times of less than 10 microseconds, the two-counter circuit described will not perform adequately.

There exists a need for a method and apparatus for detecting the peak of an electrical pulse generated by a borehole scanning system.

There exists a need for such a method and apparatus in which each detected peak value is associated with a value representing the time between the occurrence of the detected peak and the preceding firing pulse.

There exists a need for such a method and apparatus in which the peak value of a rapidly rising electrical pulse can be accurately and inexpensively associated with a value representing the time between the occurrence of the detected peak and the preceding firing pulse.

There exists a need for such a method and apparatus in which the elapsed time between a firing pulse and the following electrical pulse is measured to approximately halfway between the beginning and ending of the top of the electrical pulse.

SUMMARY OF THE INVENTION

A method and apparatus for detecting the peaks of electrical pulses and associating each detected peak value with a value representing the time at which the detected peak occurs. The method of the instant invention includes the steps of generating a timed count, monitoring the level of each electrical pulse and storing the count upon the occurrence of each electrical pulse peak. In one aspect of the invention the step of monitoring the level of the analog signal is accomplished by applying the signal to a peak and hold circuit. In another aspect of the invention, each electrical pulse is periodically sampled and each sample is converted to a digital value. Each new digital value is compared to the maximum of the preceding digit values and the new value is stored if it exceeds the preceding values. In yet another aspect of the method of the instant invention, a count is generated which is related to the time substantially halfway between the beginning and end of the top of an electrical pulse.

The apparatus of the invention includes means for performing the steps of the method of the invention.

DETAILED DESCRIPTION OF THE PREFERRED EMBODIMENTS OF THE METHOD AND APPARATUS OF THE INVENTION

The instant embodiments of the apparatus of the invention which are disclosed herein are used to process a signal generated by a borehole televiewer. The signal includes a plurality of periodic firing pulses which are generated by downhole electronics and which each initiate an acoustic pulse that is radially transmitted toward the borehole wall and reflected therefrom. Each reflected acoustic pulse is used to generate an eletrical pulse which follows each firing pulse. The magnitude of the electrical puulses so generated and the time between each firing pulse and the following electrical pulse represent information about the location and quality of the surface from which each acoustic pulse is reflected. When the borehole televiewer helically scans the wall of the wellbore, the signal so produced may be processed and used to generate a video display of the borehole wall.

Each of the embodiments of the instant invention disclosed herein process the signal generated by the borehole televiewer to provide two digital numbers for each electrical pulse. One number represents the magnitude of the highest peak of the pulse, and the other number represents the time between the firing pulse and the occurrence of the highest pulse peak. The numbers so generated are provided to a computer which is connected via control circuitry to a video monitor. Two types of displays may be presented on the monitor. First, the peak values are each assigned a different shade of gray proportional to their magnitude. The peak values for one 360° scan of the borehole are used to modulate the brightness beam of the monitor on one monitor line. Each succeeding scan of the borehole corresponds to a line on the monitor, thus generating a display of the borehole wall containing information relating to the quality of the formation in which the hole is drilled.

A second display may be generated in which each time value is assigned a shade of gray proportional to its magnitude with each scan of the borehole corresponding to a monitor line and with the brightness beam of the monitor being modulated by the time values for the related borehole scan. The time display thus provides information relating to the physical location and size of features included in the wall of the wellbore.

Figure 1:
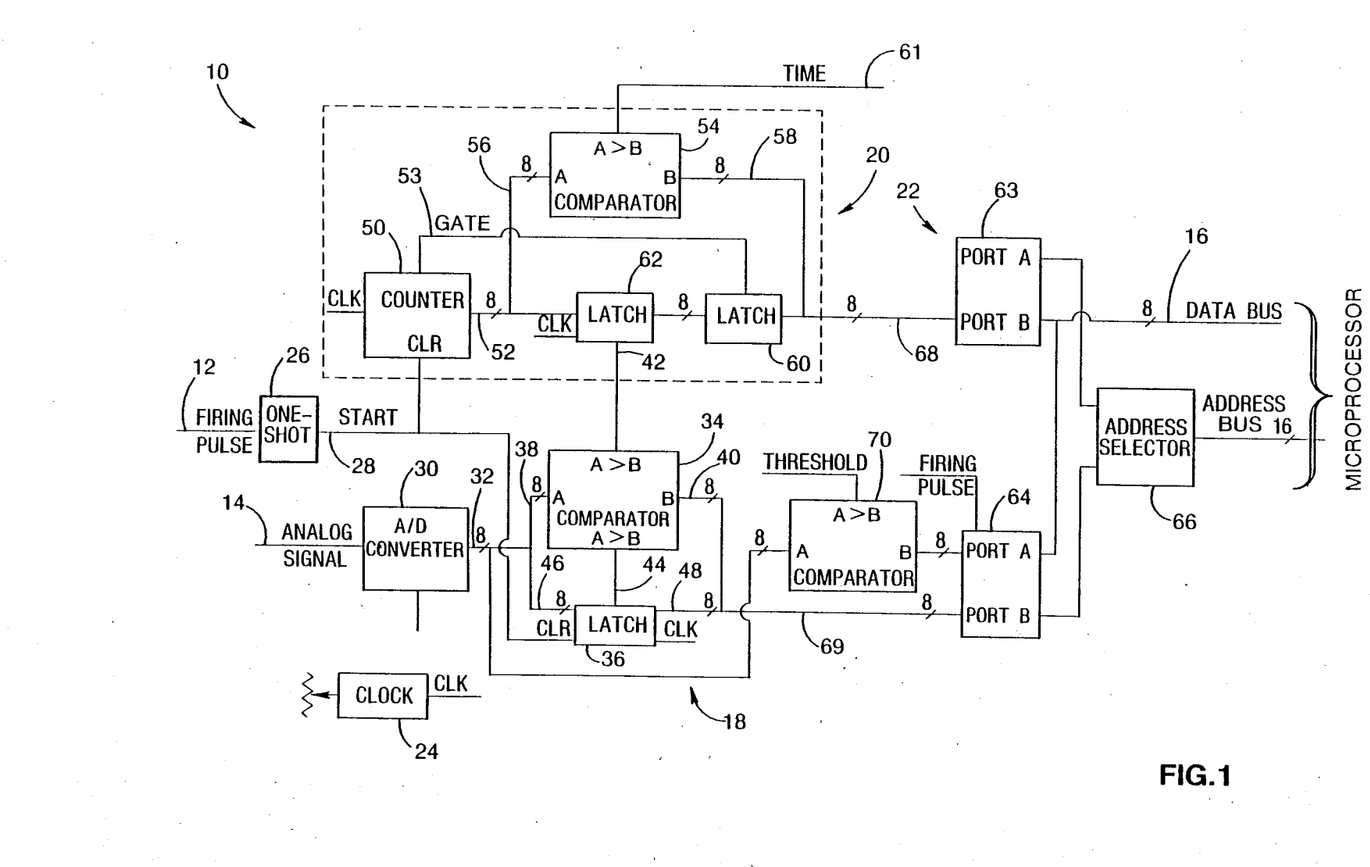
FIG. 1 is a schematic diagram of a circuit showing a portion of a first embodiment of the apparatus of the invention.

Considering now the first embodiment of the instant invention, attention is directed to FIG. 1 wherein indicated generally at 10 is a circuit constructed in accordance with the apparatus of the instant invention. Generally speaking, circuit 10 as a first input, on line 12, periodic firing pulses from a borehole televiewer, each of which initiates a corresponding acoustic pulse from the borehole televiewer. A second input, applied to line 14, consists of an analog signal which results from the reflection of each acoustic pulse and thereafter the conversion of each reflected acoustic pulse to an electrical pulse. Thus, the sequence of the inputs appearing on lines 12, 14 is as follows: first, a firing pulse on line 12 followed by the appearance of an electrical pulse on line 14. Thereafter, another firing pulse appears on line 12 followed by the associated electrical pulse on line 14. In a continuing manner, for each firing pulse appearing on line 12, an electrical pulse appears shortly thereafter on line 14 before the occurrence of the next firing pulse.

A data bus 16 provides the output of circuit 10 to a microprocessor. In FIG. 1, the slash in the line designating bus 16 and the adjacent numeral eight indicate a bus made up of eight separate conductors. Suc a bus is used to transmit 8-bit bytes of data. In the drawings, a numeral other than eight appearing adjacent a slash through a line designates a bus having the number of separate conductors indicated by the adjacent numeral.

The output appearing on data bus 16 for each firing pulse and its associated electrical pulse consists of two 8-bit numbers, one being the highest peak value of the electrical pulse and the other being the elapsed time between the occurrence of the firing pulse and the highest peak of the electrical pulse. Such data is provided to a microprocessor (not shown) and to additional circuitry which is operatively connected to a video monitor for generating a video display of the borehole wall.

Circuit 10 includes three subcircuits, a peak value detection circuit indicated generally at 18, an elapsed time detection circuit, shown enclosed in a dashed-line box and indicated generally at 20, and a microprocessor interface circuit, indicated generally at 22.

A clock 24 provides periodic digital pulses to various other components of circuit 10, including those having terminals connected to lines designated "CLK." The frequency of the periodic pulses generated by clock 24 may be selectively varied.

Line 12 is applied to the input of a one-shot multivibrator 26. The one shot generates an output pulse having a preselected length for each pulse which appears on line 12. The output of the one shot is applied to line 28. Thus, for each firing pulse, a pulse, labeled "START" in FIG. 1, appears on line 28. The one-shot multivibrator may be adjusted to selectively vary the length of the START pulse. As will become later more fully apparent, the START pulse activates both the peak value detection circuit 18 and elapsed time detection circuit 20.

In general, peak value detection circuit 18 periodically samples the electrical pulse appearing on line 14 with one sample being taken for each pulse of clock 24. Each such samples is converted to an 8-bit digital number. The first such digital number is stored. Each new digital number is compared to the stored digital number. The new number replaces the stored number only if the new number is greater than the stored number. Thus, after the electrical pulse is applied to line 14, the peak value of the signal, in the form of a digital number, is retained by peak value detection circuit 18.

Considering now in more detail the structure and operation of the peak value detection circuit, included therein is an analog-to-digital converter 30. The converter includes an input terminal which is connected to line 14 and an 8-line output bus 32. Converter 30 also receives the pulses generated by clock 24 on the CLK terminal. In operation, converter 30 measures the level of the electrical pulse appearing on line 14 and generates an 8-bit digital number proportional to the signal level for each clock pulse. Converter 30 is a commercially available analog-to-digital converter, which in the instant embodiment of the invention, samples and generates digital conversions at a maximum rate of 5 megahertz. During each clock pulse, an 8-bit number appears on bus 32 which is related to the level of the electrical pulse appearing on line 14. Bus 32 is applied to a binary digital 8-bit comparator 34, such also being referred to herein as comparator means and to a latch 36 which is referred to herein as storing means.

Comparator 34 includes a first input bus A which is connected to bus 38, a second input bus B which is connected to bus 40, and an output terminal connected to lines 42, 44. The comparator compares the value of the digital number applied to input bus A on bus 38 with the value of the number on input bus B which is applied via bus 40. If the digital number on bus A is greater than the digital number on bus B, a signal appears on the output terminal of the comparator which is applied to lines 42, 44.

Latch 36 includes an input bus which is connected to bus 46 and an output bus connected to bus 48. The latch further includes a latch terminal which is connected to line 44. In operation, when a signal appears on line 44, the latch stores the digital number appearing on bus 46. A number stored in the latch appears on bus 48. A clear terminal (connected to line 28) and a clock terminal (identified as "CLK") also form a part of latch 36. The clock signal which is applied to the latch controls the rate at which numbers appearing on bus 46 can be stored in the latch. When a signal appears on line 28, the contents of the latch are cleared, thus leaving an 8-bit number corresponding to zero stored in the latch.

In operation, peak value detection circuit 18 applies (at the clock rate) a series of digital numbers, which correspond to the level of the signal appearing on line 14, to bus A of comparator 34 and to the input bus of latch 36. If the number stored in the latch, which appears on busses 48, 40, is less than the current digital value of the electrical pulse, which appears on busses 38, 46, a signal appears on the output terminal of the comparator, and hence on line 44, which stores the current digital value on bus 46 in the latch. When the next digitized signal value appears at the output of the analog-to-digital converter, it is compared with the just-stored value in the latch. If the new value is greater than the stored value, the new value is stored in the latch. When the new digital value appearing on the output of the converter is less than the value stored in the latch, the stored value remains. It can thus be seen that after an electrical pulse is applied to line 14, the highest peak value of the pulse, represented as a digital number, is stored in latch 36.

Consideration will now be given to the structure and operation of elapsed time detection circuit 20. Broadly stated, circuit 20 initiates a count responsive to the occurrence of a firing pulse. Each time a new digital peak value is stored in latch 36, the current count is stored in circuit 20. Thus, the last count stored in circuit 20 is the count at the time the highest peak digital value of the electrical pulse was stored in latch 36 and represents the elapsed time between the occurrence of a firing pulse and the highest peak of the following electrical pulse on line 14.

Included in circuit 20 is means for generating a timed count or a counter 50. Counter 50 includes a clear terminal and a clock terminal, such being designated "CLR" and "CLK," respectively. Also included is an output bus which is connected to bus 52 and upon which appears an increasing digital count which, when begun at zero counts upwardly in 255 steps in consecutively increasing binary numbers. When the highest count (all high levels on bus 52) is reached, the counter holds that value on bus 52. When a pulse appears on the clear terminal, the count appearing on bus 52 is reset to zero and the counter begins its count. A counter output terminal is connected to line 53 and generates a GATE signal which appears on line 53. The GATE signal is at a high level only when the counter is counting and is at a low level at all other times.

A comparator 54 is substantially identical to comparator 34 and functions in the same manner. Input bus A is connected via bus 56 to the output of the counter while input bus B is connected via bus 58 to the output bus of a latch 60 which in turn has its input bus connected to the output bus of a latch 62. The input bus of latch 62 is connected to the output of the counter and to bus A of the comparator via bus 56. Latches 60, 62 are substantially identical in structure and operation to latch 36.

Operation of elapsed time detection circuit 20 is initiated in response to a firing pulse appearing on line 12 which triggers one shot 26, thus generating a START pulse having a preselected width on line 28. The falling edge of the START pulse on the clear terminal of counter 50 permits counting by the counter to be initiated with upward counting from zero appearing on bus 52. Each time a new value is stored in latch 36, the current count is stored in latch 62 which has its latch terminal connected to the output terminal of comparator 34 via line 42. When counter 50 counts to its highest level, all high levels appearing on bus 52, the GATE signal goes to zero, thus latching the value in latch 62, which appears on the output bus thereof, into latch 60. The next firing pulse clears counter 50 and initiates another upward count responsive to the START signal. During the next upward count, the value stored in latch 60 from the preceding count is compared by comparator 54 with the current count value. When the current count exceeds the latched count, a signal appears on the output terminal of comparator 54 (designated TIME on line 61), thus providing a signal which can be displayed on a scope and which indicates the value of the elapsed time between the preceding firing pulse and the highest peak of the preceding electrical pulse. As will later be explained, such a display may help in adjusting the circuit for operation.

Microprocessor interface circuit 22 includes therein a pair of commercially available programmable parallel port devices 63, 64. Each of the port devices is connected to a commercially available address selector 66. Address selector 66 decodes signals generated by the microprocessor (not shown) on its address bus which are applied to the address selector. The decoded signals are applied to port devices 63, 64 in order to select data from port B of port device 63 or from port A of port device 64 for transmission to the computer via data bus 16. A digital number from latch 60, which represents the time between the firing pulse and the highest peak of the electrical pulse, is supplied to port device 63 via bus 68. The highest peak value of the electrical pulse in digital form is stored in latch 36 and is supplied to port device 64 via bus 69. In addition, the firing pulse is provided to port device 64 and from there to data bus 16 to signal the arrival of new peak and time data.

A threshold value is provided on data bus 16 from the microprocessor to port device 64 and is applied to input bus B of a comparator 70. The threshold value is an operator-selected signal level in digital form. Comparator 70, operating like comparator 34, compares the output of analog-to-digital converter 30 with the preselected threshold value and places a high signal, labeled THRESHOLD, on the output terminal of comparator 70 when the level of the electrical pulse in digital form, which appears on bus A of comparator 70, rises above the threshold level. When the current value of the electrical pulse falls below the preselected threshold level, the output terminal of comparator 70 returns to a low level.

Figure 2:
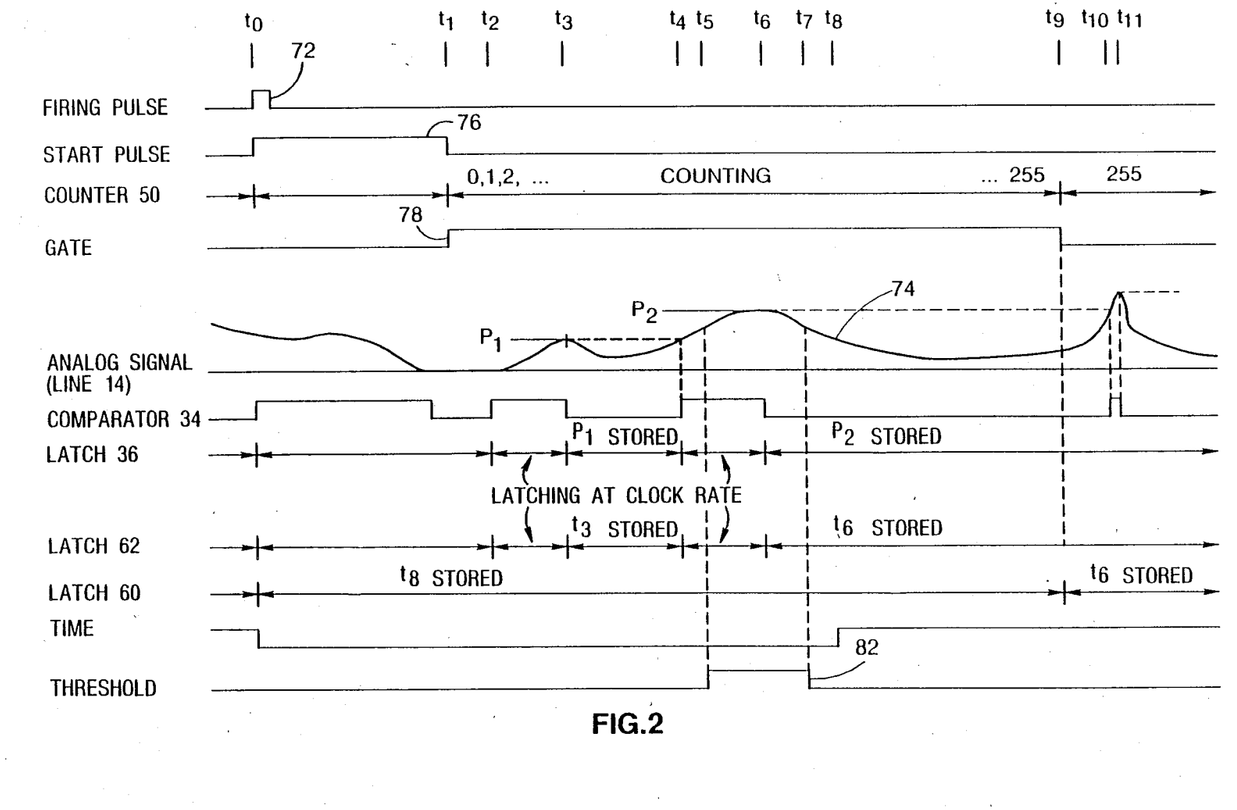
FIG. 2 illustrated selected waveforms generated by the circuit of FIG. 1.

Considering now in detail the overall operation of the circuit shown in FIG. 1, attention is further directed to FIG. 2. A firing pulse 72 appears on line 12 and is applied to the input of one-shot 26. As will be recalled, the firing pulse initiates an acoustic pulse in the borehole televiewer which is transmitted radially outwardly from the center of the borehole toward the borehole wall. The acoustic pulse is reflected by the borehole wall back toward the televiewer where it is detected and converted into an electrical pulse or analog signal 74 wich appears between $t_1$ and $t_9$, such being referred to herein as a window.

Firing pulse causes one-shot 26 to generate a START pulse 76 which clears counter 50 and latch 36 to zero. Upon the falling edge of the start pulse, counter 50 begins upward incremental counting and a GATE pulse 78 appears on line 53. As will be recalled, line 53 remains at a high level for so long as the counter continues upward counting.

Between $t_2$ and $t_3$, the level of the signal on line 14 is continuously increasing. Thus, when comparator 34 compares the digital number on bus 38 with the number on bus 40, the utput terminal of the comparator, and therefore lines 42, 44 remain at a high level between $t_2$ and $t_3$, which causes each new signal level to be latched into latch 36 and each new count to be latched into latch 62. Immediately after the signal reaches a first peak at $t_3$, the value in latch 36, which appears on bus 40 at input terminal B of comparator 34, is greater than the current signal value, which appears on input terminal A of the comparator. Accordingly, the signal level on the output terminal of the comparator, and thus on lines 42, 44 falls to zero with the level of first peak 80 being stored in latch 36 and the time between the end of the start pulse and the occurrence of the peak at $t_3$ being stored in latch 62. As signal 74 decreases and then increases after $t_3$, the output terminal of comparator 34 again goes high at $t_4$ when the level of signal 74 increases the peak at $t_3$ thus causing latches 36, 62 to begin latching new values at the clock rate. After the highest peak of electrical pulse 74 at $t_6$, the signal on the output terminal of comparator 34 again falls to zero with the highest peak value of electrical pulse 74 being stored in latch 36 and the time relative to firing pulse 72 at which the highest peak occurred being stored in latch 62.

At $t_9$, counter 50 reaches its maximum count and holds at that level. As soon as the maximum count is reached, GATE pulse 78 goes to zero, thus latching the value in latch 62 into latch 60, which applies that value to port B of port device 63. The peak value of electrical pulse 74 is stored in latch 36 and the same is applied to port B of port device 64. With both values of interest being applied to port B of port devices 63, 64, signals from the microprocessor via address selector 66 cause the values applied to the port devices to be stored in computer memory via data bus 16.

Assume that the time count stored in latch 60 for the electrical pulse preceding firing pulse 72 is $t_8$. Until the end of gate pulse 78, $t_8$ remains stored in latch 60. At the end of the GATE pulse $t_6$, the time at which the peak of signal 74 occurred is stored. Comparator 54 generates a high signal on the output terminal thereof when the current time exceeds time stored in latch 60. Thus, at $t_8$ the output terminal of comparator 54, shown as the TIME signal in FIG. 2, rises to a high level.

The threshold level, which as will be recalled is supplied from the microprocessor via data bus 16 to port A of port device 64, is compared with the current signal value on input bus A of comparator 70. When the current signal value is greater than the threshold value, a THRESHOLD signal 82 is generated. The threshold level defines a level below which digital numbers representing peak values are ignored. Sometimes, for example when a borehole wall includes a fissure, there is no or very little reflected acoustic pulse, thus resulting in a nonexistent or negligible electrical pulse, generated by the acoustic reflection. This condition is conveniently sensed by detecting when the signal falls below an operator-selected threshold value which is supplied to the microprocessor. Deletion of levels below the selected threshold level is performed under control of the microprocessor. The THRESHOLD signal enables operator adjustment of the selected threshold level by simultaneously observing the analog signals, like signal 74, and the THRESHOLD signals, like signal 82, on, e.g., an oscilloscope display. The THRESHOLD, TIME and GATE signals may be viewed on a scope in order to appropriately adjust the length of the START pulse and the frequency of counting of clock 24 to assure that electrical pulses, like analog signal 74, are being detected during the gate pulse.

Figure 3:
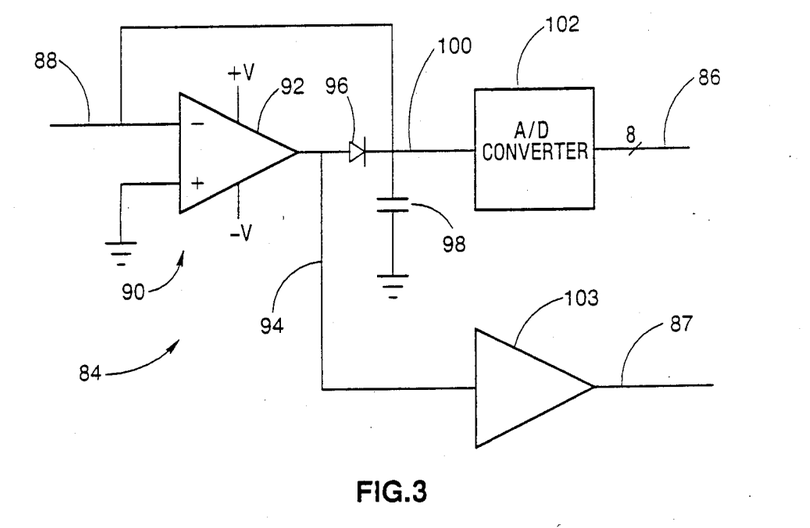
FIG. 3 is a schematic diagram of a circuit showing a portion of a second embodiment of the apparatus of the invention.

Indicated generally at 84 in FIG. 3 is a portion of a second circuit constructed in accordance with the apparatus of the instant invention. Circuit 84 can be used to replace peak value detection circuit 18 in FIG. 1, including analog-to-digital converter 30, comparator 34, and latch 36. Circuit 84 is interconnected with the remainder of the circuit in FIG. 1 by placing bus 86 on port B of device 64 (in lieu of bus 69) and by placing line 87 on the latch terminal of latch 62 (in lieu of line 42). The analog signal generated by the acoustic reflection is applied to line 88 in circuit 84. Circuit 84 achieves the same end result as the circuit shown in FIG. 1. That is, the highest peak value of the electrical pulse applied to line 88 is calculated along with the elapsed time between the highest peak and the preceding firing pulse. These values are converted to digital numbers and applied to data bus 16 for transmission to a microprocessor.

Included in circuit 84 is a peak and hold circuit 90, such also being referred to herein as means for detecting the peak value of each electrical pulse. Circuit 90 includes an amplifier 92 having the output thereof applied to line 94. The output of the amplifier is also applied to the anode of a diode 96 having its cathode connected to a capacitor 98. The diode-capacitor junction is connected via line 100 to an analog-to-digital converter 102 which is substantially identical in structure and operation to analog-to-digital converter 30. Line 94 is connected to the input of a zero cross detector 103 with the output thereof connected to line 87 which, as will be recalled, is connected to the latch terminal of latch 62 in FIG. 1.

In operation, a firing pulse is applied to line 12 and thus initiates the START pulse on line 28 which clears counter 50 and causes initiation of counting at the end of the START pulse. After the occurrence of the firing pulse and during the occurrence of the GATE pulse on line 54, an electrical pulse 104, in FIG. 4, appears on line 88. When pulse 104 is applied to the input of amplifier 92, the output produces an amplified version of pulse 104 for so long as the voltage level in pulse 104 increases. When the voltage level decreases, i.e., just after a peak in the pulse level, diode 96 becomes nonconducting and amplifier 92 drives to its negative maximum. The signal on line 94 is indicated in solid line form at 106 in FIG. 4. Capacitor 98 holds the maximum voltage generated by the output of amplifier 92 with the signal on the capacitor being shown in solid line form at 108 in FIG. 4. Once the signal level rises above first peak 110, the output of the amplifier again tracks the input of the signal until highest peak 112 at which point line 94 is again driven to a negative value by the amplifier and line 100 holds the peak level. The output of zero cross detector 103 changes conditions, as shown generally at 114, each time the signal on line 94 passes through zero.

Referring again to FIG. 3, it can be seen that the highest peak value of the electrical pulse appears in digital form on line 86 and that the signal appearing on line 87 latches the count in counter 50 into latch 62 on the trailing edge of the last pulse of signal 114 which occurs at the same time as the highest peak of electrical pulse 104. Thus, at the end of the GATE pulse, as in the operation of the circuit of FIG. 1, the elapsed time value which is stored in latch 62 is clocked into latch 60 which applies the same to port B of port device 63 while the highest peak value appears on the output of analog-to-digital converter 102 which is applied to port B of device 64, thus providing the elapsed time and highest peak value digital numbers to the microprocessor.

Figure 4:
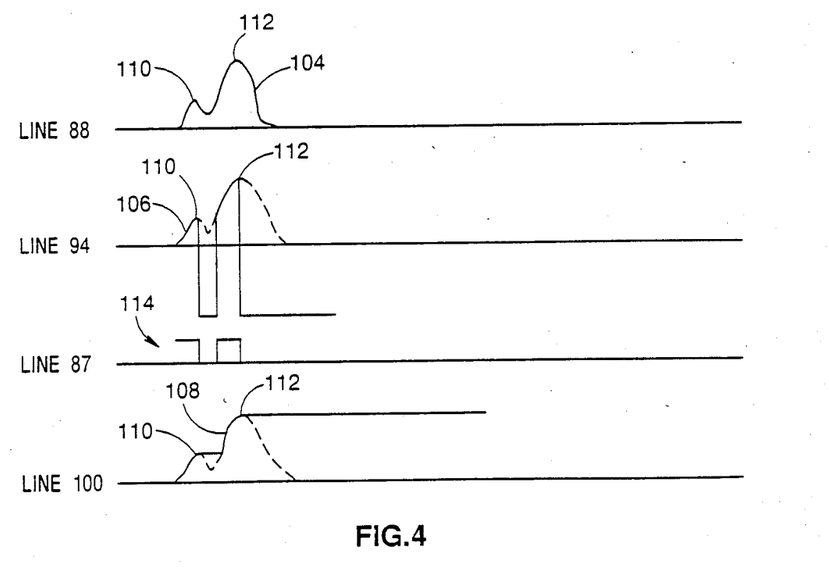
FIG. 4 illustrates selected waveforms generated by the circuit of FIG. 3.
Figure 5:
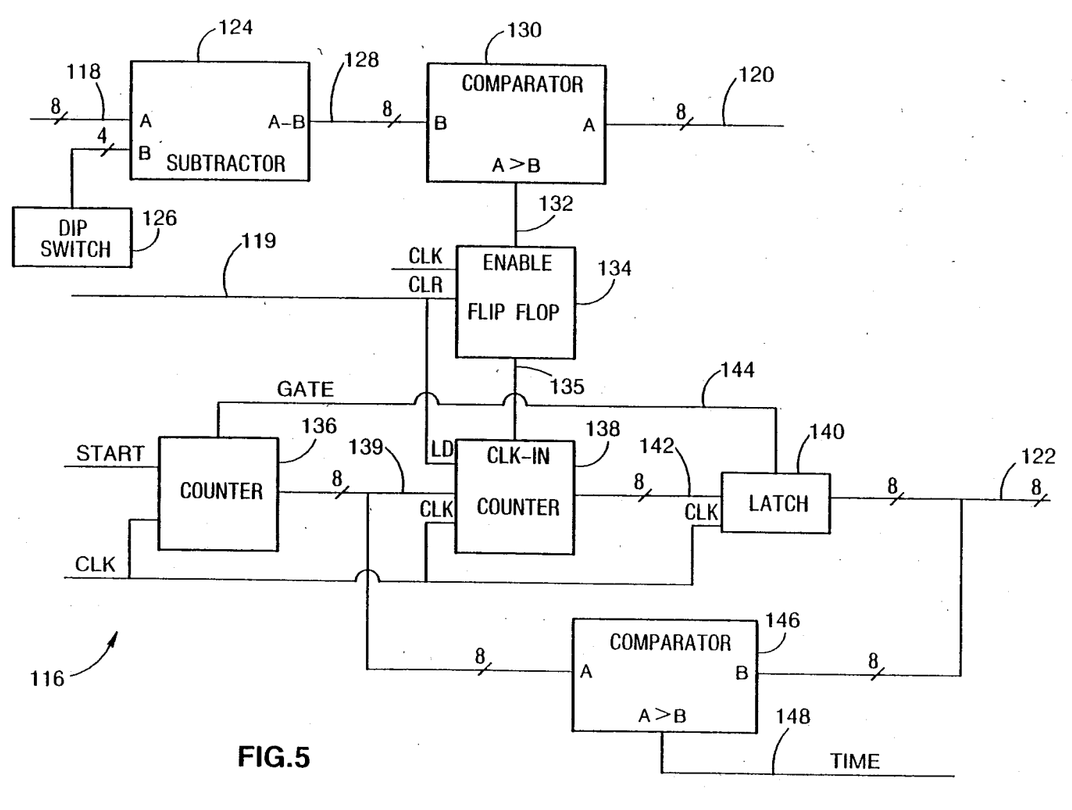
FIG. 5 is a schematic diagram of a circuit showing a portion of a third embodiment of the apparatus of the invention.
Figure 7:
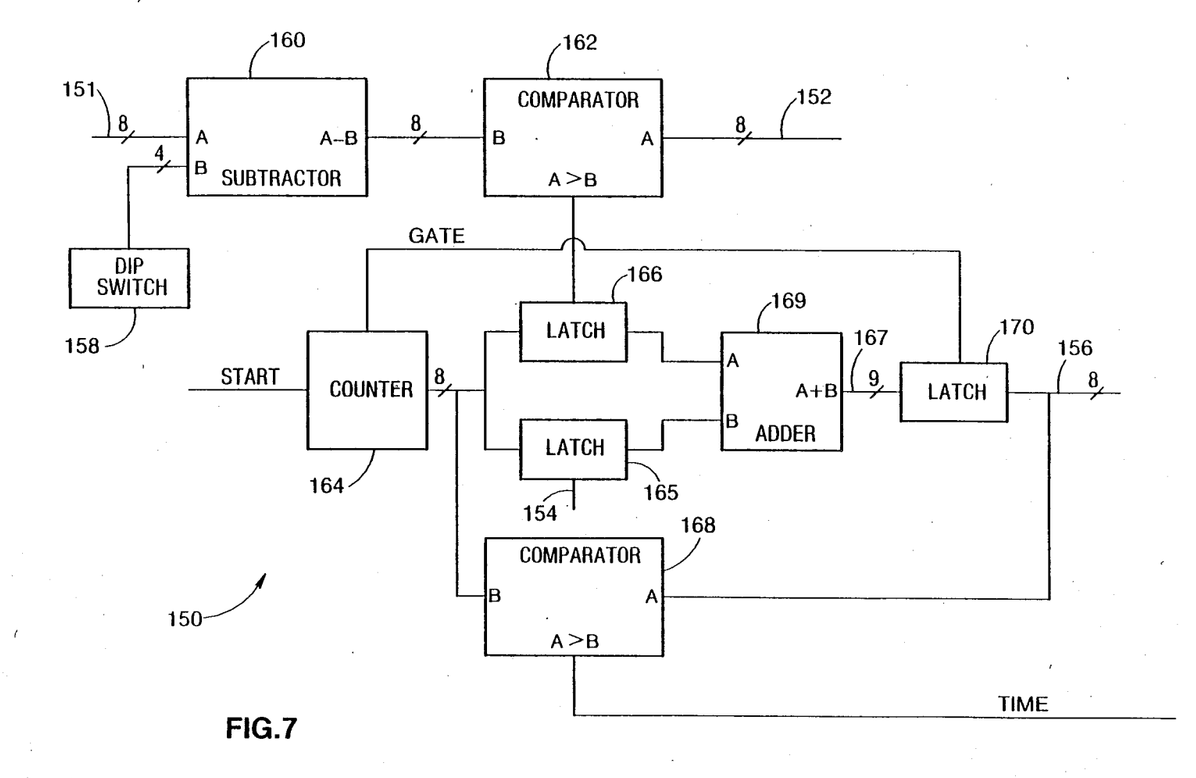
FIG. 7 is a schematic diagram of a circuit showing a portion of a fourth embodiment of the apparatus of the invention.

When the circuit of FIG. 1 or the circuit of FIG. 3 is used to detect a pulse having a relatively well defined peak, like the peaks of pulse 74 in FIG. 2 and the peaks of pulse 104 in FIG. 4, each circuit accurately measures the elapsed time from the preceding firing pulse to the pulse peak. However, if the electrical pulse has a relatively flat peak or top, that is if it approaches a square wave, the detection of a peak occurring just after the leading edge of the pulse stops counter 50 in FIG. 1. It would be more accurate in the case of a pulse having a flat top to identify the time of the pulse as being substantially half way between the beginning and end of the pulse top. FIGS. 5 and 7 each disclose a different embodiment of the invention which achieves this result.

First considering the embodiment of FIG. 5, indicated generally at 116 is a portion of a circuit constructed in accordance with the instant invention. Circuit 116 is a modified version of elapsed time detection circuit 20 in FIG. 1. Circuit 116 replaces elapsed time detection circuit 20 in FIG. 1 and is connected to peak value detection circuit 18 and microprocessor interface 22 as follows. Bus 118 is connected to the output bus of latch 36 in FIG. 1 and is thus provided with the current maximum value of the electrical pulse in digital form. Line 119 is connected to the output terminal of comparator 34. Bus 120 is connected to the output bus of analog-to-digital converter 30 and is thus provided with the current value of the electrical pulse in digital form. Bus 122 is provided to port B of port device 63 instead of bus 68 as shown in FIG. 1.

As will be seen, circuit 116 detects the highest peak value of the electrical pulse appearing on line 14 and also generates an elapsed time value between the preceding firing pulse and a time which is approximately half way between the beginning and end of the top of the electrical pulse. When the electrical pulse includes a well defined peak, the elapsed time calculated by circuit 116 will be substantially the same as the elapsed time calculated by the circuits of FIGS. 1 and 3; however, when the electrical pulse is substantially a square wave, the elapsed time calculated by the circuit of FIG. 5 will be the elapsed time from the occurrence of the preceding firing pulse to a point substantially half way between the beginning and end of the top of the electrical pulse. When a substantially square wave electrical pulse is applied to the circuit of FIG. 1, the elapsed time calculated is between the preceding firing pulse to the peak value of the electrical pulse which may occur very shortly after the leading edge of the pulse.

Generally speaking, the circuit of FIG. 5 initiates a normal speed count upon the occurrence of a firing pulse. When the peak of the electrical pulse is detected, a half speed count is initiated. Thereafter, when the electrical pulse falls below a preselected level, the half speed count is stopped. The sum of the normal speed and half speed counts represents the elapsed time between the firing pulse and a point substantially half way between the beginning and end of the top of the electrical pulse.

Considering now in more detail the structure of circuit 116, bus 118 is connected to input bus A of subtractor 124. The output of a dual in-line package (DIP) switch 126 is connected to input terminal B of subtractor 124. The output terminal of the subtractor is connected to a bus 128 with the number appearing on bus 128 being equal to the number on input bus A minus the number on input bus B. DIP switch 126 is used to manually select a 4-bit digital number, which appears on the 4-conductor bus connected to the switch output, for application to input terminal B of subtractor 124.

The output of the subtractor is applied to input terminal B of a comparator 130 which has substantially the same structure and operates in substantially the same manner as previously-described comparators. When the value on input terminal B of comparator 130 is less than the value on input terminal A (which is connected to the output terminal of analog-to-digital converter 30), a high signal is generated on line 132. Line 132 is connected to an enable terminal on flip flop 134. The flip flop also receives the clock pulses on a clock terminal as shown with the output terminal of the flip flop being applied to a line 135. When the enable terminal is at a low level, line 135 is held at a low level. When the enable terminal goes to a high level, the output of the flip flop on line 135 consists of one pulse for every other clock pulse. In other words, flip flop 124 divides the clock pulses by two and places the result on line 135 when enabled.

Counters 136, 138 are constructed in the same manner as the previously-described counters and operate in substantially the same manner except that counter 138 includes a load terminal (designated "LD") which, when at a high level, causes the digital number appearing on bus 139, which is supplied to the counter input, to be loaded into the counter. Thereafter, the counter counts upwardly from the loaded number at the rate of pulses appearing on the "CLK-IN" terminal of counter 138.

A latch 140 stores the number appearing on bus 142 when line 144, which is connected to the latch terminal, goes to a low level.

A comparator 146 compares the value of the number stored in latch 140 with the output of counter 136 and generates a signal on line 148 when the current count of counter 136 exceeds the value stored in latch 140.

Considering now in more detail the operation of circuit 116, a firing pulse on line 12, in FIG. 1, initiates the START pulse which clears latch 36 and which starts counter 136 counting at the falling edge of the START pulse. For so long as the electrical pulse (signal 149 in FIG. 6) is increasing, circuit 116 functions in a manner similar to elapsed time detection circuit 20 in FIG. 1. That is, the output signal generated by comparator 34, which appears on line 119 in FIG. 5, causes each new count from counter 136 to be loaded into counter 138. When the peak of signal 149 occurs at time $t_1$, $t_1$ is loaded into counter 138 and no further loading occurs due to the absence of the output signal generated by comparator 34 on line 119.

Figure 6:
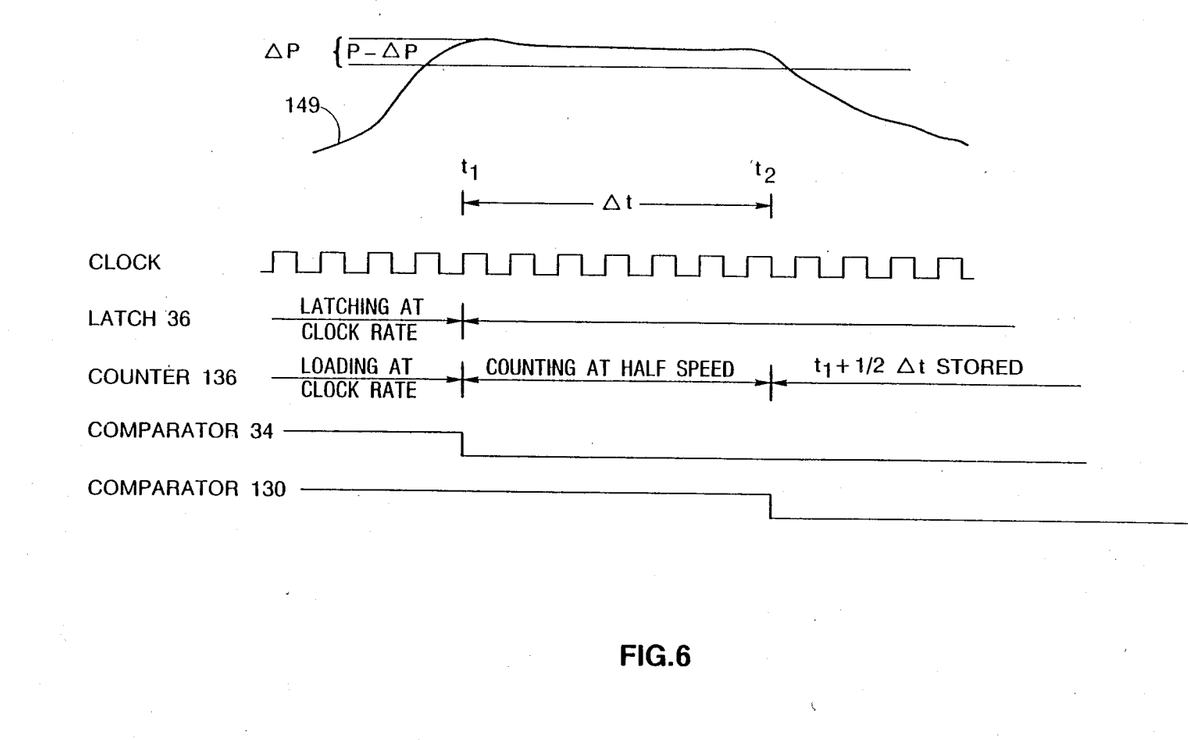
FIG. 6 illustrates selected waveforms generated by the circuit of FIG. 5.

Subtractor 124 subtracts the peak value from a preselected value set by DIP switch 126 which is shown on signal 149 as delta P. The output of subtractor 124, after $t_1$, is equal to P (the peak value) minus delta P. This value is compared by comparator 130 with the current analog signal value from the output of analog-to-digital converter 30 and a signal appears on line 132 for so long as the signal level is above P minus delta P. For so long as the signal appears on line 132, flip flop 134 is enabled for counting at half speed which count appears on line 135. Since counter 138 is being continuously loaded up until time $t_1$, counter 138 does not begin counting until $t_1$, at which time no further loading occurs due to the absence of a signal on line 119. At this point, counter 138 begins counting upwardly from $t_1$ at half of the clock frequency. At $t_2$ the signal on line 132 goes to zero, thus eliminating the half speed count on line 135. Counter 138 then holds at a value equal to $t_1 + \frac{1}{2}(t_2 - t_1)$.

When counter 136 counts out, the GATE pulse on line 144 ends, thus latching the count in counter 138 into latch 140 at which time it appears on port B of port device 63. Peak value detection circuit 18 in FIG. 1 holds the peak value detected at $t_1$ in latch 36 which is applied to port B of port device 64. The time and peak values are now in condition for transmission to the microprocessor via data bus 16 as previously described in connection with the description of the operation of the circuit in FIG. 1.

Considering now a fourth embodiment of the apparatus of the invention, indicated generally at 150, in FIG. 7 is a portion of a circuit constructed in accordance with the instant invention. Like the circuit of FIG. 5, the FIG. 7 circuit represents an alternative version of elapsed time detector 20 and is intended for use with the components of the FIG. 1 circuit other than those in elapsed time detection circuit 20. The circuit of FIG. 7 accomplishes the same result as that of FIG. 5, i.e., elapsed time for an electrical pulse which is substantially a square wave is measured between the preceding firing pulse and a point substantially half way between the beginning and end of the top of the electrical pulse. Circuit 150 achieves this result in a different manner than the circuit of FIG. 7. Circuit 150 initiates a count upon the occurrence of each firing pulse and stores the value of the count at the time when the peak value of the following electrical pulse is detected. Thereafter, the value of the count at the time when the reflected electrical pulse falls below a preselected level is stored and each stored count value is added and divided by two, thus providing an elapsed time measured to the mid-point of the top of the electrical pulse.

The circuit of FIG. 7 replaces circuit 20 in FIG. 1 as follows. Bus 151 is connected to the output of latch 36 while bus 152 is connected to the output of analog-to-digital converter 30. Line 154 is connected to the output terminal of comparator 34 while bus 156 is connected to port B of port device 63 instead of bus 68 as shown in FIG. 1.

Circuit 150 includes a DIP switch 158, a comparator 162 and a subtractor 160 which have the same structure and function and are connected in substantially the same manner as switch 126, subtractor 124, and comparator 130 in the circuit of FIG. 5.

A counter 164, like the previously-described counters, has the output thereof applied to the input of latches 165, 166. Each latch output is applied to an input terminal of an adder 169 having an output connected to a bus 167 upon which appears the sum of the numbers on adder input terminals A, B. A comparator 168 compares the value on the output of counter 164 with the value stored in a latch 170.

In operation, a firing pulse appearing on line 12 initiates the START pulse from one shot 26, the trailing edge of which starts counter 164 counting. Since line 154 is connected to the output of comparator 34 in FIG. 1, latch 165 continuously latches counts from counter 164 up to and including the time of the peak value of the electrical pulse, corresponding to time $t_1$ in FIG. 6. Upon the occurrence of the peak, the signal generated by the output terminal of comparator 34 and therefore line 154 goes up to zero and the time corresponding to $t_1$ is stored in latch 165. When the value of the electrical pulse falls beneath P minus delta P, comparator 162 provides a signal on its output terminal which causes the count at $t_2$ to be latched into latch 166. The digital number in latch 165, corresponding to $t_1$, and the digital number in latch 166, corresponding to $t_2$, are added by adder 169 with a 9-bit value appearing at the output of the adder on bus 167. Latch 170 latches only the high 8-bits which appear on the adder output, thus effectively dividing the adder output by two and storing the result in latch 170. The value stored in latch 170 thus corresponds to $(t_1+t_2)/2$. This value is stored in the latch after counter 164 counts to its highest number, thus ending the GATE pulse. Thereafter, the digital numbers corresponding to peak and time values are transmitted to the microprocessor on data bus 16 as previously described.

It can now be seen that circuits constructed in accordance with the apparatus of the invention offer several advantages over the prior art. First, the circuit of the invention accurately detects and stores the time between the occurrence of a preceding pulse and the highest peak of a following analog signal. Secondly, signals which fall below a preselected threshold level are not eliminated by the circuit of the invention. All digital signal values are stored and may be later manipulated to screen values below a threshold. This obviates the problem associated with prior art circuits in which a boot signal or noise burst which rises above a threshold level and occurs before the leading edge of an electrical pulse stops an elapsed time counter. Threshold screening after digitization also prevents erroneous deletion of low amplitude electrical pulses. Finally, in one aspect of the invention, elapsed time is measured to substantially the mid point of the top of an electrical pulse, thus providing greater accuracy when signals having flat tops are present.

It is to be appreciated that variations and additions may be made to the specific embodiments of the methods and apparatus of the invention disclosed herein without departing from the spirit of the invention which is defined in the following claims.

What is claimed is:

1. A method for associating an electrical pulse generated by a borehole scanning system with a value related to the time at which said electrical pulse occurs, said method comprising the steps of:
   detecting a peak value of the electrical pulse;
   detecting a second value at which said electrical pulse falls below a preselected level, said preselected level being less than the peak value of said electrical pulse; and
   computing the time half way between the time at which said peak value occurs and the time at which said second value occurs.

2. The method of claim 1 wherein the step of computing the time half way between the time at which said peak value occurs and the time at which said second value occurs comprises the steps of:
   initiating a half speed count upon the peak of said eletrical pulse being detected and
   stopping said half speed count upon the value of said electrical pulse falling below said preselected level.

3. The method of claim 2 wherein said method further includes the steps of:
   generating a normal speed count prior to detecting the peak of said electrical pulse;
   stopping the normal speed count upon the peak of said electrica pulse being detected and
   adding said half speed count and said normal speed count.

4. The method of claim 1 wherein said method further comprises the steps of:
   initiating a count prior to detection of the peak of said electrical pulse;
   storing a peak value of said count upon the peak value of said electrical pulse being detected;
   storing another value of said count upon said electrical pulse falling below said preselected level;
   adding said stored count values; and
   dividing the sum of said stored count values by two.

5. Apparatus for associating an electrical pulse generated by a borehole scanning system with a value related to the time at which said electrical pulse occurs, said apparatus comprising:
   means for detecting a peak value of the electrical pulse;
   means for detecting a second value at which said electrical pulse falls below a preselected level, said preselected level being less than the peak value of said electrical pulse; and
   means for computing the time half way between the time at which said peak value occurs and the time at which said second value occurs.

6. The apparatus of claim 5 wherein said means for computing the time half way between the time at which said peak value occurs and the time at which said second value occurs comprises:
   means for initiating a half speed count upon the peak of said electrical pulse being detected and
   means for stopping said half speed count upon the value of said electrical pulse falling below said preselected level.

7. The apparatus of claim 6 wherein said apparatus further comprises:
   means for generating a normal speed count prior to detecting the peak of said electrical pulse;
   means for stopping the normal speed count upon the peak of said electrical pulse being detected and
   means for adding said half speed count and said normal speed count.

8. The apparatus of claim 5 wherein said apparatus further comprises:
   means for initiating a count prior to detection of the peak of said electrical pulse;
   means for storing the value of said count upon the peak value of said electrical pulse being detected
   means for storing the value of said count upon said electrical pulse falling below said preselected level
   means for adding said stored count values; and
   means for dividing the sum of said stored count values by two.

* * * * *